United States Patent
Hong et al.

(10) Patent No.: US 11,397,218 B2
(45) Date of Patent: Jul. 26, 2022

(54) METHOD FOR DIAGNOSING SUB-MODULE STATE DURING INITIAL CHARGE OF MMC CONVERTER

(71) Applicant: HYOSUNG HEAVY INDUSTRIES CORPORATION, Seoul (KR)

(72) Inventors: Jung Won Hong, Bucheon-si (KR); Hong Ju Jung, Seoul (KR); Hyun Ho Yoo, Seoul (KR); Joo Yeon Lee, Seoul (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 128 days.

(21) Appl. No.: 16/769,106

(22) PCT Filed: Dec. 20, 2018

(86) PCT No.: PCT/KR2018/016394
§ 371 (c)(1),
(2) Date: Jun. 2, 2020

(87) PCT Pub. No.: WO2019/132428
PCT Pub. Date: Jul. 4, 2019

(65) Prior Publication Data
US 2021/0165049 A1 Jun. 3, 2021

(30) Foreign Application Priority Data

Dec. 28, 2017 (KR) .................. 10-2017-0183186

(51) Int. Cl.
*G01R 31/40* (2020.01)
*H02M 7/483* (2007.01)
(52) U.S. Cl.
CPC ............ *G01R 31/40* (2013.01); *H02M 7/483* (2013.01)

(58) Field of Classification Search
CPC ... G01R 31/40; G01R 31/2607; H02M 7/483; H02M 1/32; H02M 1/36; H02M 7/4835
(Continued)

(56) References Cited

U.S. PATENT DOCUMENTS

2004/0042039 A1* 3/2004 Kodera .................. G06K 15/00
399/9
2005/0027481 A1* 2/2005 Yang ....................... H01L 22/20
702/183
(Continued)

FOREIGN PATENT DOCUMENTS

JP    2015-095926 A    5/2015
KR    10-1521105 B1    5/2015
(Continued)

*Primary Examiner* — Giovanni Astacio-Oquendo
(74) *Attorney, Agent, or Firm* — Novick, Kim & Lee, PLLC; Jae Youn Kim

(57) ABSTRACT

A method for diagnosing a state of a submodule in initial charging of an MMC converter includes identifying, by an upper level controller, a stopped state of the MMC converter; supplying, by the upper level controller, an alternating current (AC) voltage from an AC side to N submodules in the MMC converter when the MMC converter is in the stopped state; charging a capacitor in the submodule with the supplied AC voltage to store an initial charging voltage in the capacitor; determining, by a submodule controller, whether the submodule is in a fault state and when the submodule is in a fault state, transmitting a fault signal to the upper level controller; and detecting, by a voltage detection unit of the submodule the initial charging voltage stored in the capacitor and transmitting the initial charging voltage to the submodule controller.

3 Claims, 8 Drawing Sheets

(58) Field of Classification Search
USPC .................................. 324/764.01, 537, 500
See application file for complete search history.

(56) References Cited

U.S. PATENT DOCUMENTS

| | | | |
|---|---|---|---|
| 2008/0140928 A1* | 6/2008 | Lu | ........................... G06F 3/061 |
| | | | 711/112 |
| 2009/0160423 A1* | 6/2009 | Chi | ................... H03K 19/0016 |
| | | | 323/352 |
| 2013/0194758 A1* | 8/2013 | Lin | ..................... H05K 1/0243 |
| | | | 361/729 |
| 2021/0152099 A1* | 5/2021 | Oh | ........................ H02M 7/483 |

FOREIGN PATENT DOCUMENTS

| | | |
|---|---|---|
| KR | 101521105 B1 * | 5/2015 |
| KR | 10-1668431 B1 | 10/2016 |
| KR | 10-1758301 B1 | 7/2017 |
| KR | 10-2017-0090911 A | 8/2017 |
| KR | 20170090911 A * | 8/2017 |

* cited by examiner

| SM1 ~ SM4 ARE ALL NORMAL | | |
|---|---|---|
| SUBMODULE | ACTUAL SM VOLTAGE [V] | SM VOLTAGE INFORMATION RECEIVED IN UPPER LEVEL CONTROLLER [V] |
| SM #1 | 1000 V | 1000 V |
| SM #2 | 1000 V | 1000 V |
| SM #3 | 1000 V | 1000 V |
| SM #4 | 1000 V | 1000 V |
| SUM OF SM VOLTAGES | 4000 V | 4000 V |
| DIAGNOSIS RESULT | NORMAL | |

FIG. 5A

| SM #4 IS FAULTY |||
|---|---|---|
| SUBMODULE | ACTUAL SM VOLTAGE [V] | SM VOLTAGE INFORMATION RECEIVED IN UPPER LEVEL CONTROLLER [V] |
| SM #1 | 1330 V | 1330 V |
| SM #2 | 1330 V | 1330 V |
| SM #3 | 13300 V | 13300 V |
| SM #4 | 0 V (bypass) | 0 V (bypass) |
| SUM OF SM VOLTAGES | 4000 V | 4000 V |
| DIAGNOSIS RESULT | NORMAL ||

FIG. 5B

| SM1 ~ SM4 ARE ALL NORMAL | | |
|---|---|---|
| SUBMODULE | ACTUAL SM VOLTAGE [V] | SM VOLTAGE INFORMATION RECEIVED IN UPPER LEVEL CONTROLLER [V] |
| SM #1 | 1000 V | 1000 V |
| SM #2 | 1000 V | 1000 V |
| SM #3 | 1000 V | 1000 V |
| SM #4 | 1000 V | 0 V |
| SUM OF SM VOLTAGES | 4000 V | 3000 V |
| DIAGNOSIS RESULT | FAULTY | |

FIG. 5C

| SM #4 IS FAULTY |||
|---|---|---|
| SUBMODULE | ACTUAL SM VOLTAGE [V] | SM VOLTAGE INFORMATION RECEIVED IN UPPER LEVEL CONTROLLER [V] |
| SM #1 | 1000 V | 1000 V |
| SM #2 | 1000 V | 1000 V |
| SM #3 | 1000 V | 1000 V |
| SM #4 | 1000 V | 0 V |
| SUM OF SM VOLTAGES | 4000 V | 3000 V |
| DIAGNOSIS RESULT | FAULTY ||

FIG. 5D

METHOD FOR DIAGNOSING SUB-MODULE STATE DURING INITIAL CHARGE OF MMC CONVERTER

TECHNICAL FIELD

The present invention relates to a method for diagnosing a state of a submodule, and in particular, to a method for diagnosing a state of a submodule during initial charging of a modular multilevel converter (MMC), which diagnoses a state of a submodule by identifying a charging voltage during initial charging of the submodule before operation of the MMC.

BACKGROUND ART

A High Voltage Direct Current (HVDC) system converts an alternating current (AC) power produced in a power plant into DC power and transmits the DC power, and a power receiving stage re-converts the DC power into AC power and supplies the AC power to a load. Such an HVDC system is advantageous in that power may be efficiently and economically transmitted via voltage boosting, and in that connections between heterogeneous systems and long-distance high-efficiency power transmission are possible.

Further, a Static Synchronous Compensator (STATCOM) is a kind of Flexible AC Transmission System (FACTS) device, and denotes an electric power electronics-based compensator, which is connected to a power system and is used to increase power transmission capacity and to maximize the usage of existing facilities. Such a STATCOM system is advantageous in that power systems are compensated in parallel using a voltage-type power semiconductor device, thus stabilizing the systems by maintaining voltage at a constant value.

An MMC converter may be connected to an HVDC system or a STATCOM. The MMC converter includes a plurality of submodules connected in series to each other and performs voltage conversion and serves as a path of current for power transmission.

FIG. 1 is a schematic configuration diagram of a conventional general MMC converter.

Referring to FIG. 1, an MMC converter 10 includes for example, three legs 13a, 13b, and 13c and six arms 11a, 11b, 11c, 12a, 12b and 12c and each of the arms includes a plurality of submodules SM. The arm may be composed of upper arms 11a, 11b and 11c and lower arms 12a, 12b and 12c. In the drawing, as an example, four submodules SM are illustrated for each arm, but the number of such submodules SM may be changed, of cause.

The MMC converter 10 converts a DC-side input voltage Vdc input through a bus into an AC-side output voltage through the three legs 13a, 13b and 13c and outputs the AC-side output voltage. The output voltage varies depending on the on/off state of a submodule SM included in each arm. That is, when four submodules are included in each of the upper arm and the lower arm as an example, the output voltage may be adjusted in five phases (the number of submodules+1) according to the number of submodules (SM) maintaining an On state. In this case, the on/off of the switches of the submodules SM in each arm may be controlled in order to adjust the output voltage.

FIG. 2 is an exemplary diagram of a configuration of a submodule of a general MMC converter. The submodule SM includes a so-called half bridge circuit including a pair of power semiconductors 21 and a capacitor 22 connected in parallel to the power semiconductors 21. The power semiconductor 21 includes a power semiconductor element 21a and a diode 21b connected in reverse parallel to the power semiconductor element 21a. Although not shown, the submodule SM may be configured as a full bridge circuit using the power semiconductor 21 and the capacitor 22.

In the MMC converter, the submodule SM is a very important component, and in the prior art, the MMC converter is designed to monitor a state of voltage stored in each submodule SM during the operation of the MMC converter, and when an error occurs in the submodule (SM), allow submodule controller to take appropriate measures.

In the prior art, the MMC converter can diagnoses the state of the submodule SM, and in this case, when the MMC converter is operated in a state where a fault occurs in the submodule SM, it may cause an explosion. Especially, the MMC converter needs to bypass current around the submodule in which the fault occurs and when the capacitor is charged with voltage due to a specific cause, there is a risk that the corresponding submodule may explode during operation.

Accordingly, there is a need for a technique capable of diagnosing the state of each submodule at the initial start of the MMC converter in the related art field.

DISCLOSURE

Technical Problem

An object of the present invention is to provide a method for diagnosing a state of a submodule, capable of diagnosing a state of a submodule at the time of initial charging of an MMC converter before normally operating the MVDC converter connected to an HVDC system or STATCOM.

In addition, another object of the present invention is to provide a method for diagnosing a state of a submodule, capable of taking necessary measures before operation of an MMC converter by quickly and simply determining the state of the submodule without additional devices during initial charging of the MMC converter.

In addition, still another object of the present invention is to provide a method for diagnosing a state of a submodule, in which an MMC converter diagnoses whether there is a case in which a submodule, in which a fault occurs, does not bypass current and is charged with voltage.

Technical Solution

According to the present invention, a method for diagnosing a state of a submodule in initial charging of an MMC converter includes identifying, by an upper level controller, a stopped state of the MMC converter; supplying, by the upper level controller, an alternating current (AC) voltage from an AC side to N submodules in the MMC converter when the MMC converter is in the stopped state; charging a capacitor in the submodule with the supplied AC voltage to store an initial charging voltage in the capacitor; determining, by a submodule controller, whether the submodule is in a fault state and when the submodule is in a fault state, transmitting a fault signal to the upper level controller; detecting, by a voltage detection unit of the submodule the initial charging voltage stored in the capacitor and transmitting the initial charging voltage to the submodule controller; transmitting, by the submodule controller, the received initial charging voltage to the upper level controller; and determining, by the upper level controller, whether the fault signal is received from the submodule controller and diagnosing a state of each of the submodules using the initial charging voltages of the submodules.

According to an embodiment, the upper level controller receives an initial charging voltage of a first submodule in a state in which a fault signal for at least one first submodule of the N submodules is not received, and when the received initial charging voltage of the first submodule is equal to initial charging voltages of other remaining submodules, determines that the first submodule is in a normal state.

According to an embodiment, in a state in which a fault signal for at least one first submodule of the N submodules is received, when an initial charging voltage of the first submodule is lower than initial charging voltages of other remaining submodules by a predetermined difference or more, the upper level controller determines that the first submodule is in a normal state.

According to an embodiment, in a state in which a fault signal for at least one first submodule of the N submodules is not received, when an initial charging voltage of the first submodule is not received or an initial charging voltage which is different from initial charging voltages of other remaining submodules is received, the upper level controller determines that the first submodule is in a fault state.

According to an embodiment, the upper level controller receives an initial charging voltage of a first submodule in a state in which a fault signal for at least one first submodule of the N submodules is received, and when the received initial charging voltage of the first submodule is equal to initial charging voltages of other remaining submodules, determines that the first submodule is in a fault state.

According to an embodiment, in a state in which a fault signal for at least one first submodule of the N submodules is received, when a sum of initial charging voltages of remaining submodules other than the first submodule is not equal to an entire voltage of a converter arm including the N submodules, the upper level controller determines that the first submodule is in a fault state.

According to an embodiment, in a state in which a fault signal for at least one first submodule of the N submodules is received, when initial charging voltages of K remaining submodules other than the first submodule is lower than an entire voltage M of a converter arm including the N submodules by a voltage of M/k, the upper level controller determines that the first submodule is in a fault state.

Advantageous Effects

According to the present invention, it is possible to determine a state of a submodule by identifying a charging voltage stored in the submodule during the initial charging of the MMC converter before normal operation of the MMC converter, thus making it possible to take appropriate measures on the submodule that is in an abnormal state before the MMC converter is fully operated.

In addition, according to the present invention, it is possible to prevent an explosion of the MMC converter due to a submodule in which a fault occurs by preliminarily identifying the submodule in which a fault occurs before the operation of the MMC converter.

In addition, according to the present invention, it is possible to identify a communication line problem with an upper level controller for each of a plurality of submodules constituting the MMC converter, thereby enabling stable operation of the MMC converter.

DESCRIPTION OF DRAWINGS

FIGS. 5A to 5D are exemplary views showing an initial charging voltage and a diagnosis result for describing a method of diagnosing a state of a submodule in an upper level controller according to an embodiment of the present invention.

MODE FOR INVENTION OR BEST MODE

Figure 1:
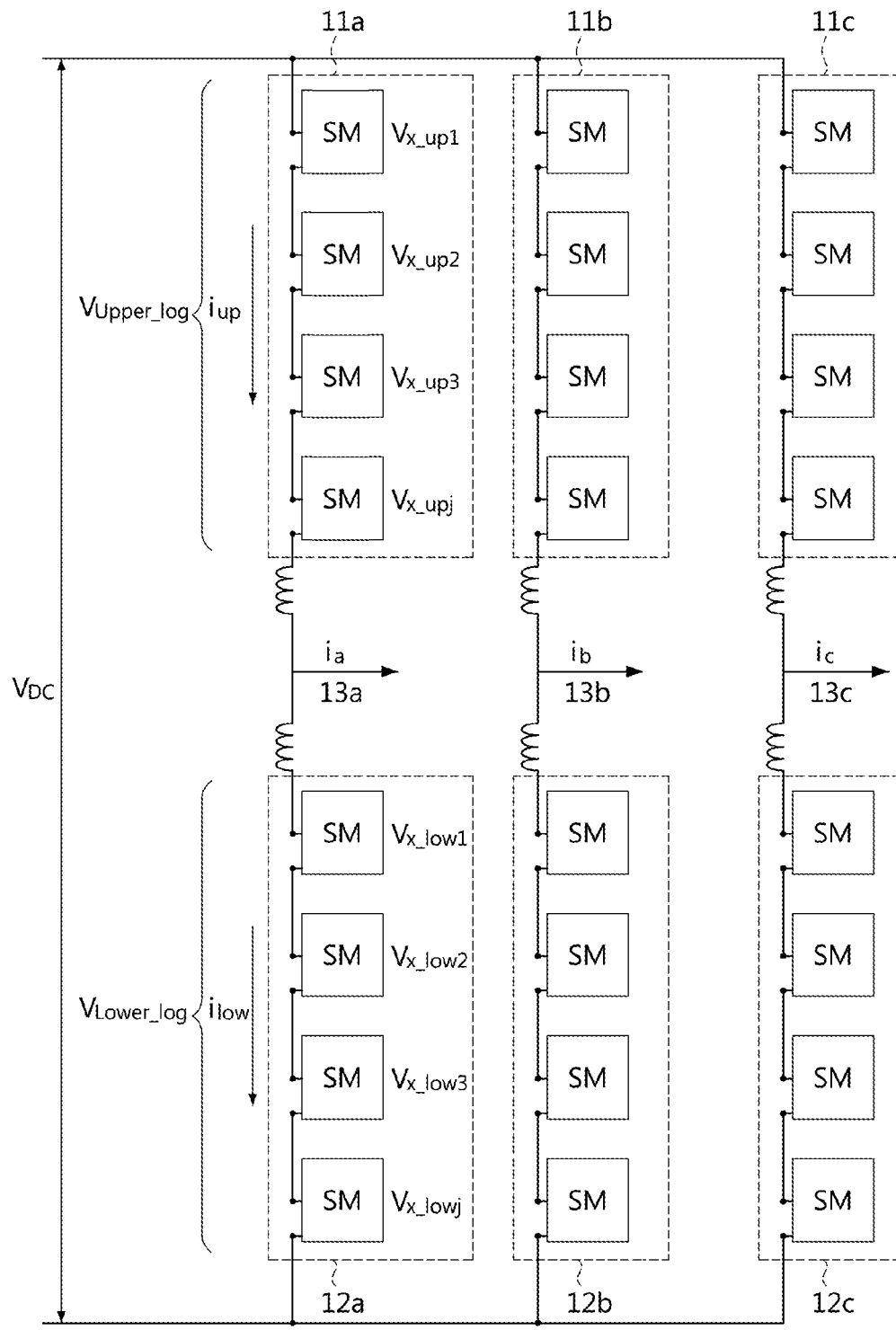
FIG. 1 is a schematic configuration diagram of a conventional general MMC converter.
Figure 2:
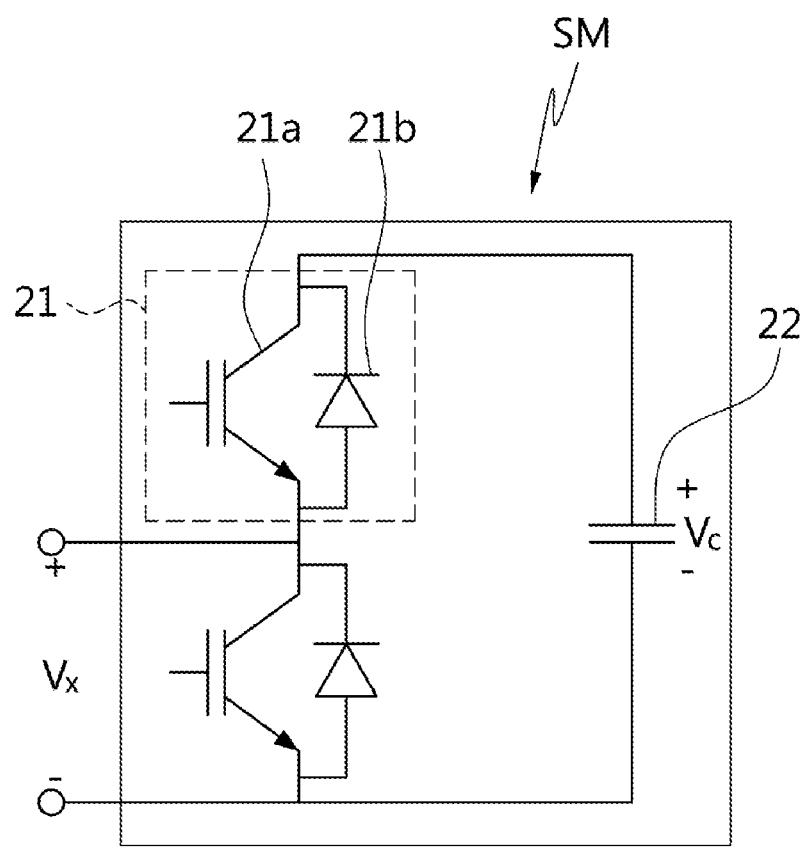
FIG. 2 is an exemplary diagram of a configuration of a submodule of a general MMC converter.

Hereinafter, some embodiments of the present invention will be described in detail with reference to the exemplary drawings. In adding reference numerals to the components of each drawing, it should be noted that the same reference numerals are assigned to the same components as much as possible even though they are shown in different drawings. In addition, in describing the embodiment of the present invention, if it is determined that the detailed description of the related known configuration or function interferes with the understanding of the embodiment of the present invention, the detailed description thereof will be omitted.

In addition, in describing the components of the embodiments of the present invention, terms such as first, second, A, B, (a), and (b) may be used. These terms are only for distinguishing the components from other components, and the nature and order, etc. of the components are not limited by the terms. If a component is described as being "connected", "combined", or "coupled" to another component, the component may be directly connected or combined with the another component, but it should be understood that still another component may be "connected", "combined", or "coupled" to each of the components therebetween.

Figure 3:
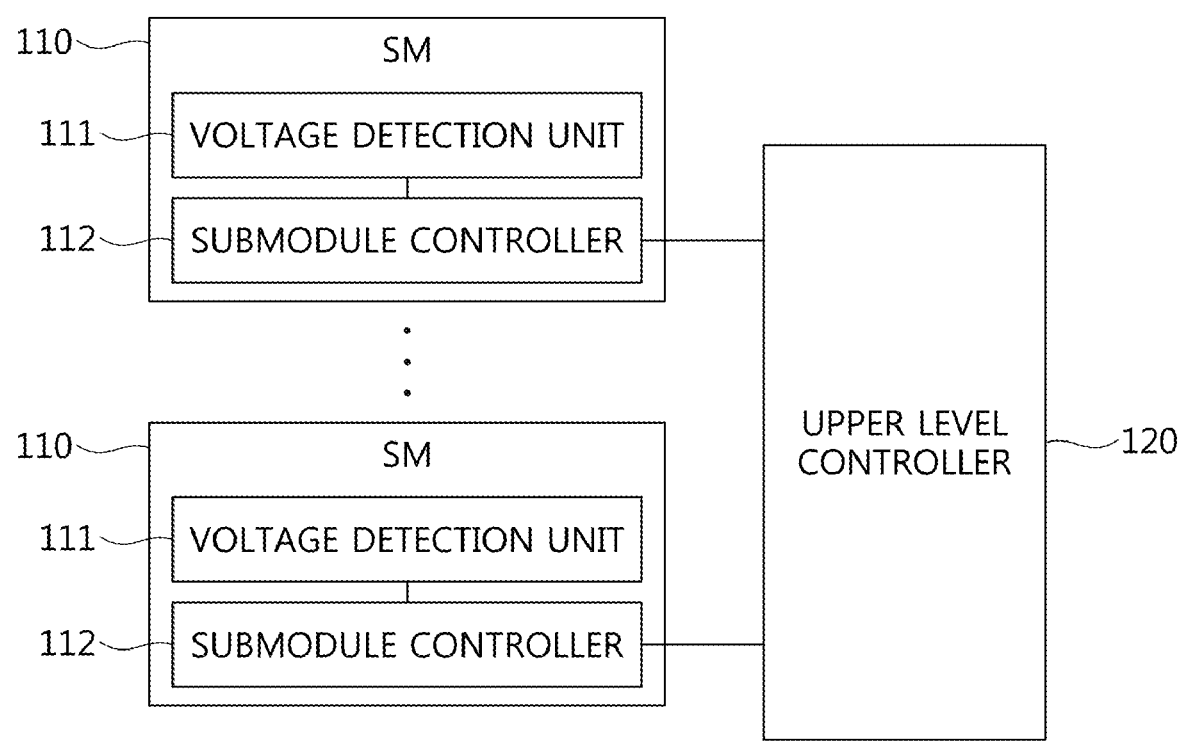
FIG. 3 is a configuration diagram of an MMC converter system according to an embodiment of the present invention.

FIG. 3 is a configuration diagram of an MMC converter system according to an embodiment of the present invention.

In FIG. 3, the MMC converter system according to the present invention includes a plurality of submodules 110 and an upper level controller 120.

As is well known, each of the submodules 110 includes a plurality of switching elements and a capacitor therein to charge or discharge the capacitor with voltage according to the switching operation of the switching elements, and, in some cases, may be controlled to bypass current through the switching elements.

Each of the submodules 110 further includes a voltage detector 111 that detects a voltage stored in the capacitor and a submodule controller 112 that controls an overall operation of the submodule 110. The submodule controller 112 communicates with the upper level controller 120 and controls the switching operation of the switching elements as described above to control charging and discharging of the capacitor with voltage and, if necessary, to bypass current.

In the present embodiment, the voltage detector 111 detects a charging voltage of the capacitor in real time and transmits the detected voltage to the submodule controller 112. Accordingly, the submodule controller 112 transmits the detected voltage of the capacitor received from the voltage detector 111 to the upper level controller 120 through a predetermined communication line.

The upper level controller 120 may receive information on a charging voltage of the capacitor in each of the submodules 110 from the plurality of submodule controllers 112 and diagnose the state of the corresponding submodule 110. In the present embodiment, the upper level controller 120 may be a converter arm controller or a further-upper level controller. The upper level controller 120 may specifically identify whether a submodule is in a normal state or a fault stare according to information on charging voltage of each sub module 110 received from each submodule controller 112.

In the present embodiment, each of the submodule controllers 112 may identify whether the submodule 110 is in a normal state or a fault stare. The fault may include a hardware (H/W) fault and a software (S/W) fault. To this end, a program or software for determining a fault may be installed. When a fault occurs in the corresponding submodule 110, the submodule controller 112 may immediately notify the upper level controller 120 of the occurrence of the fault through the communication line. In this case, the identification information of the submodule may be also notified. Accordingly, the upper level controller 120 may take into account the submodule in the normal state and the submodule in the fault state in the case of operating the MMC converter.

Figure 4:
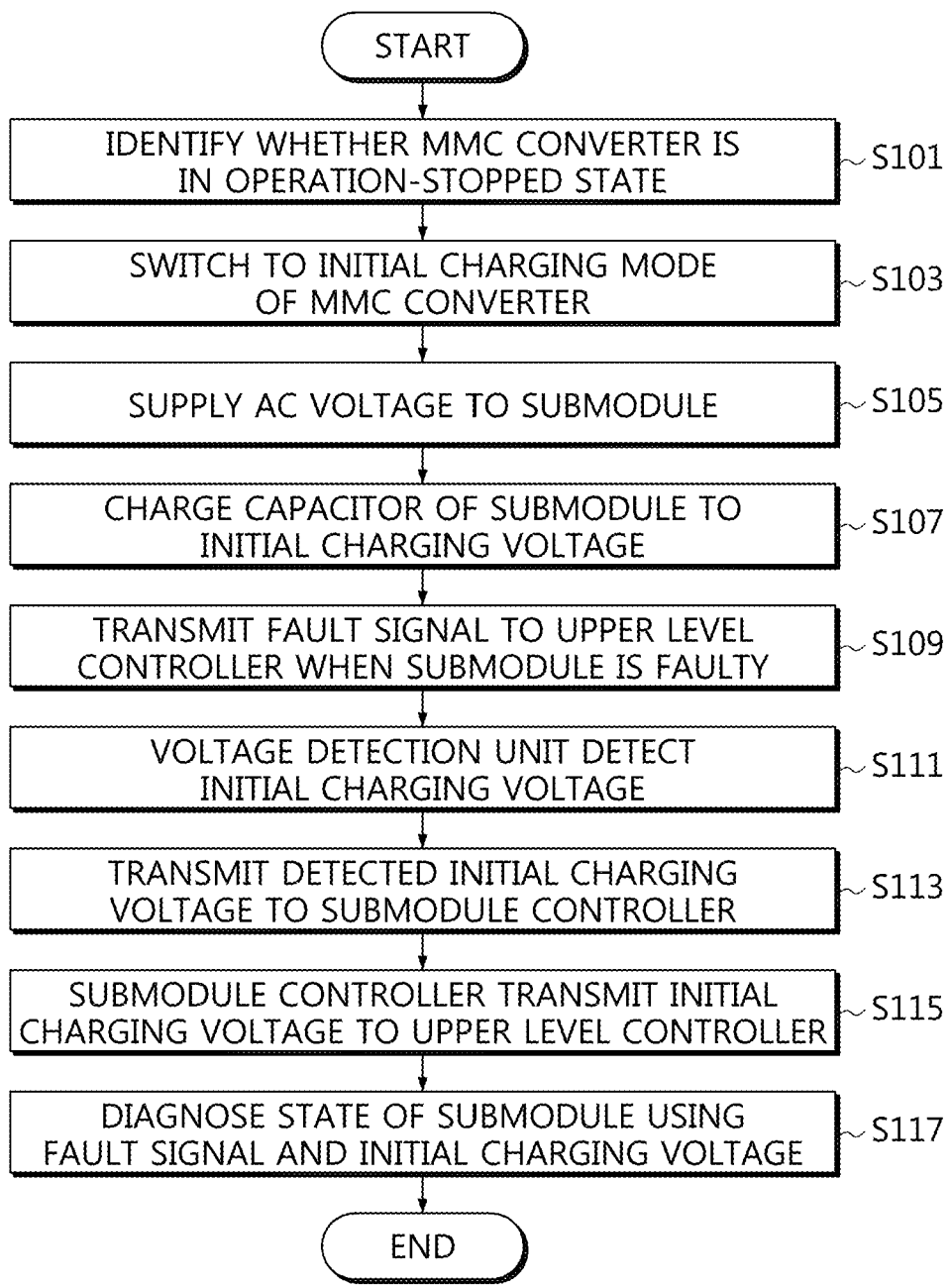
FIG. 4 is a flowchart for describing a method for diagnosing a state of a submodule during initial charging of an MMC converter according to an embodiment of the present invention.

FIG. 4 is a flowchart for describing a method for diagnosing a state of a submodule during initial charging of an MMC converter according to an embodiment of the present invention. Referring to FIG. 4, the method for diagnosing a state of a submodule during initial charging of an MMC converter according to the present invention includes may include diagnosing whether a submodule is faulty using the voltage stored in a capacitor of the submodule when performing the initial charging by supplying AC voltage to the submodule before the MMC converter is normally operated in a state in which the operation of the MMC converter is stopped.

In this case, the determination of whether or not the submodule is faulty is to diagnose whether an abnormality occurs in the submodule determined as being normal until the present time in the case of the initial charging of the MMC converter and whether another abnormality occurs in the submodule determined as being is faulty.

In other words, it is determined whether the submodule, which had normally participated in the operation of the MMC converter previously, has any fault due to any cause while the operation of the MMC converter is stopped, or whether the submodule, which had not participated in the operation of the MMC converter due to a fault previously, has another fault due to any cause or does not operate normally during operation of the MMC converter. The determination may represent diagnosis in advance before normally operating the MMC converter again after stopping the MMC converter.

Among the plurality of submodules 110 constituting a converter arm of the MMC converter, there are not only a normal submodule but also a submodule in which a fault has already occurred in the previous normal operation of the MMC converter and current has been bypassed by the upper level controller 120 and the submodule controller 112 without being participated in the operation of the MMC converter.

As described above, instead of diagnosing the state of a submodule during normal operation of the MMC converter, it is performed to diagnose whether each submodule is faulty using a state of an initial charging voltage state of the submodule in the case of storing an initial charging voltage in a capacitor of each submodule by supplying AC current to each submodule when the MMC converter is initially charged before normal operation, that is, before the operation of the MMC converter.

The process of diagnosing the states of the plurality of submodules 110 in the upper level controller 120 will be described in more detail with reference to FIG. 4. Referring to FIG. 4, the upper level controller 120 may identify whether the MMC converter is in an operation-stopped state (S101). When it is identified that the MMC converter is in the operation-stopped state, a mode is switched to an initial charging mode of the MMC converter in order to store the initial charging voltage in the submodule 110 to operate the MMC converter again (S103).

When the mode is switched to the initial charging mode, AC voltage may be supplied to the submodule from the AC side of the MMC converter under the control of the upper level controller 130 (S105). Accordingly, the initial charging voltage is stored in a capacitor of the submodule (S107).

In this case, as described above, a plurality of submodules may include not only a normal submodule, but also a submodule in which a fault has already occurred. In the normal submodule, the initial charging voltage is stored in the capacitor as in step S107, but the submodule in which a fault has occurred may bypass the current due to the AC voltage through the switching operation of an internal switch element.

Accordingly, as described above, when the initial charging voltage is stored in the capacitors of each submodule, the submodule controller 112 of the submodule 110 in which the fault has occurred may transmit a fault signal indicating that the corresponding submodule 110 is faulty to the upper level controller 120 (S109).

Thereafter, a voltage detection unit 111 of each submodule 110 may detect a voltage of the capacitor of the submodule 110 (S111) and transmit the same to the submodule controller 112 (S113). Accordingly, the submodule controller 112 may transmit the voltage to the upper level controller 120 (S115).

As described above, the initial charging voltage may be detected not only in the submodule in a normal state but also in the submodule in a fault state. In the submodule which is in the normal state, a constant voltage is detected because the initial charging voltage is stored in the capacitor, but in the submodule which is in the fault state, a voltage of 0V is detected or a small amount of voltage is detected in the capacitor because the current is bypassed.

In this way, in the submodule in the fault state, the submodule controller 112 may transmit a fault signal to the upper level controller 120 and the voltage detecting unit 111 may detect the initial charging voltage of the capacitor and transmit the same to the upper level controller 120 through the submodule controller 112 and in the submodule in the normal state, the voltage detection unit 111 may detect the initial charging voltage stored in the capacitor, and transmit the same to the upper level controller 120 through the submodule controller 112 without transmitting the above-described fault signal.

The upper level controller 120 may diagnose a state of each corresponding submodule 110 using the initial charging voltage of the submodule 110 and the fault signal transmitted from the submodule controller 120 of each submodule 110 (S117).

FIGS. 5A to 5D are exemplary views showing an initial charging voltage and a diagnosis result for describing a method of diagnosing a state of a submodule in an upper level controller according to an embodiment of the present invention. FIGS. 5A to 5D show four submodules SM1 to SM4 for convenience of description, and describes a voltage across a converter arm (or each phase) as being 4000V as an example, but the present invention is of course not limited to these examples and it is natural that the number of submodules and a total voltage of the converter arm may be changed depending on the actual environment of the MMC converter.

First, FIG. 5A shows an example in which all of submodules SM1 to SM4 are normal. Assuming that the total voltage across a converter arm including four submodules SM1 to SM4 is 4000V, since the voltage is evenly distributed and charged to the normal submodules SM1 to SM4, each of the submodule SM1 to SM4 is initially charged to an SM voltage of 1000V and the voltage detection units 111 of the submodules detect an SM voltage of 1000 V individually and transmit them to the submodule controller 112. Accordingly, the submodule controller 112 transmits the detected voltage to the upper level controller 120. The upper level controller 120 receives the SM voltage of 1000V of each corresponding submodule 110 from each submodule controller 112.

In this case, since all four submodules SM1 to SM4 are normal, the submodule controller 112 of each submodule does not transmit a fault signal to the upper level controller 120. Accordingly, the upper level controller 120 receives the SM voltage of 1000V from the submodules 110 individually in a state in which a fault signal is not received from each submodule controller 112. Accordingly, the upper level controller 120 identifies that the initial charging voltage of each of the four submodules is 1000 V in a state in which the total voltage of the converter arm is 4000 V and the fault signal is not received, and diagnoses a normal state. This example applies equally to at least one or more submodules, not only to SM4.

Preferably, since a preset total voltage of the converter arm is 4000V and the sum of the received voltages of the submodules is 4000V (=1000V×4), all submodules SM1 to SM4 are diagnosed as a normal state.

As in the above example, the upper level controller 120 receives the initial charging voltage of the first submodule SM4 in a state in which a fault signal for at least one first submodule SM4 of the N submodules SM1 to SM4 is not received and determines the first submodule SM4 to be in a normal state when the received initial charging voltage of the first submodule SM4 is equal to the initial charging voltage of the other submodules SM1 to SM3.

FIG. 5B shows an example in which a part SM4 of a plurality of submodules SM1 to SM4 are faulty. In this example, since a fault occurs in SM4, the submodule controller 112 of SM4 transmits a fault signal of a corresponding submodule SM4 to the upper level controller 120. Then, the upper level controller 120 identifies that a fault has occurred in SM4. In addition, the submodule controller 112 of SM4 switches an internal switching element to bypass an incoming current since the corresponding submodule SM4 is in a fault state.

In this case, assuming that the total voltage across a converter arm composed of four submodules SM1 to SM4 is 4000V, the initial charging voltage is evenly distributed to the normal three submodules SM1 to SM3. That is, when the total voltage of 4000V of the converter arm is evenly distributed, a voltage of 1330V is stored to the submodules SM1 to SM3 individually, and in the SM4 which is faulty, a current is bypassed and the capacitor does not store the voltage and a voltage of 0V is detected. Of course, when a voltage remains in the capacitor, a small voltage value other than 0V may be detected.

The voltage detection units 111 of the three normal submodules SM1 to SM3 detect a charging voltage of 1330V individually and transmit the charging voltage to each corresponding submodule controller 112, and the voltage detection unit of SM4 detects a voltage of 0V or another value and transmits the same to the submodule controller.

Accordingly, the upper level controller 120 receives the voltage of 1330V from the submodule controllers of the normal three submodules SM1 to SM3, and receives a fault signal and the voltage of 0V from the submodule controller of the submodule SM4 in which a fault occurs. Accordingly, the upper level controller 120 determines that all submodules SM1 to SM4 operate normally because a voltage of 0V or another value is received in the state in which the fault signal of SM4 is received. That is, since SM4 is in a fault state, SM4 is determined as operating normally when a current is bypassed.

Furthermore, preferably, all submodules are diagnosed as a normal state by identifying that the total voltage of the converter arm is 4000 V and the sum of the received voltages of the submodules is 4000V (=1330V×3). Since the voltage of 4000V stored in the normal three submodules SM1 to SM3 is the same as that of the converter arm, the submodules of the converter arm are diagnosed as normal.

As in the above example, the upper level controller 120 may determine the first submodule SM4 to be in a normal state, when the initial charging voltage of the first submodule SM4 is lower than the those of the other submodules SM1 to SM3, preferably, when the initial charging voltage of SM4 is lower than the initial charging voltage of the remaining submodules SM1 to SM3 by a predetermined difference or more in a state where a fault signal for at least one first submodule SM4 of N submodules SM1 to SM4 is received.

In FIG. 5C, assuming that the total voltage across the converter arm composed of four submodules is 4000V in a state in which the four submodules SM1 to SM4 are in a normal state as in the example of FIG. 5A, the voltage of 4000V is normal submodules SM1 to SM4.), the SM voltage of 1000V is evenly distributed to and stored in the normal submodules SM1 to SM4, so that an SM voltage of 1000V is stored in the submodules SM1 to SM4 individually, and the voltage detection unit 111 of each submodule detects the SM voltage of 1000V for each submodule and transmits it to the corresponding submodule controller 112.

Each submodule controller 112 does not transmit a fault signal to the upper level controller 120 because the submodules SM1 to SM4 are in a normal state, and transmits only the SM voltage of 1000V received from each voltage detection unit 111 to the upper level controller 120. Then, since the submodules SM1 to SM4 are in a normal state, the upper level controller 120 may necessarily receive the SM voltage of 1000 V from all the submodule controllers 112, individually.

However, as in the example of FIG. 5C, even though the upper level controller 120 does not receive a fault signal from the submodule controller 112 of SM4, the upper level controller 120 diagnoses fault occurrence in SM4 when receiving a voltage of 0V or another value, not the initial charging voltage of 1000V.

Preferably, in this case, the upper level controller 120 identifies that the voltage of 1000V is received the other submodules SM1 to SM3 individually, and diagnoses that a fault occurs in SM4 because the sum of the SM voltages becomes 3000V and is not equal to 4000V when the voltage of SM4 is 0V. Of course, in this case, the upper level controller 120 should identify that the fault signal is not received from the submodule controller 112 of SM4.

As in the above example, the upper level controller 120 may determine the first submodule SM4 to be in a normal state, when the initial charging voltage of the first submodule SM4 is not received or when an initial charging voltage different from those of the remaining submodules SM1 to SM3 is received in a state where a fault signal for at least one first submodule SM4 of N submodules SM1 to SM4 is not received.

FIG. 5D shows an example in which a fault occurs in SM4 among a plurality of submodules SM1 to SM4, as in the example of FIG. 5B, and when assuming that the total voltage across a converter arm composed of the submodules SM1 to SM4 is 4000V, the normal three submodules SM1 to SM3 each need to be at a voltage of 1330V. Here, since SM4 is faulty, the submodule controller 112 of SM4 transmits a fault signal to the upper level controller 120.

However, as shown in the example of FIG. 5D, when the current is not bypassed and the SM4 is charged even though the SM4 is faulty, the total voltage of 4000V of the converter arm is evenly stored in the four submodules SM1 to SM4, and the voltage of 1000 v is stored in the submodules individually. Accordingly, the submodule controllers 112 of all four submodules SM1 to SM4 notify the upper level controller 120 of the voltage of 1000 V, individually.

The upper level controller 120 diagnoses that the SM4 is faulty when a voltage of 1000V is received even in a state in which a fault signal is received from the submodule controller 112 of SM4. Since the fault signal of SM4 has been received, the upper level controller 120 needs to receive, from the remaining SM1 to SM3, a voltage of 1330V individually, as shown in FIG. 5B. In FIG. 5D, since the voltage of 1000V is received from the three normal submodules SM1 to SM3 individually, the upper level controller 120 identifies a voltage difference and diagnoses SM4 as being faulty.

Preferably, the total voltage of the converter arm is 4000V, but the voltage received from the submodules SM1 to SM4 becomes 3000V, so that it is determined that a fault has occurred in the SM4 of which the fault signal is received.

As in the above example, in a state where a fault signal for at least one first submodule SM4 of N submodules SM1 to SM4 is received, the upper level controller 120 may determine the first submodule SM4 to be in a fault state, when the initial charging voltage of the first submodule SM4 is received or the received initial charging voltage of the first submodule SM4 is equal to the initial charging voltage of the remaining submodules SM1 to SM3.

In addition, when a current is not bypassed due to any cause and the initial charging voltage is stored to SM4 even though SM4 is faulty, the total voltage of 4000V of the converter arm is 4000V is stored in such a way that a voltage of 1000V is the four submodules SM1 to SM4 individually.

In this case, the submodule controller 112 of the SM4 transmits the voltage of 1000V to the upper level controller 120 like the other submodules SM1 to SM3. Accordingly, the upper level controller 120 may diagnose SM4 as being faulty since the voltage of 1000V is received although the fault signal has been received from the submodule controller 112 of SM4. The reason for this is that the voltage of 0V should be received when the fault signal for SM4 is received, but the voltage of 1000V is received. When comparing the received SM voltages, the upper level controller 120 may diagnose the fault state of SM4 because it is required that the sum of the voltages of the submodules is 3000 V because the other submodules SM1 to SM3 are at the voltage of 1000 V, but the total voltage of the actual total voltage of the converter arm is 4000 V.

As in the above example, in a state where a fault signal for at least one first submodule SM4 of N submodules SM1 to SM4 is received, the upper level controller 120 may determine the first submodule SM4 to be in a fault state, when the sum of the initial charging voltages of remaining submodules SM1 to SM3 other than the first submodule SM4, that is 3000V (=1000V×3) is not equal to the total voltage 4000V of the converter arm.

In addition, preferably, since the fault occurs in SM4, the other remaining submodules SM1 to SM3 should receive a voltage of 1330V, individually. However, in FIG. 5D, the voltage of 1000V is received from three submodules SM1 to SM3 individually, and the upper level controller 120 identifies the voltage of 1000V and diagnoses the SM4 from which the fault signal is received as being faulty.

As in the above example, in a state where a fault signal for at least one first submodule SM4 of N submodules SM1 to SM4 is received, the upper level controller 120 may determine the first submodule SM4 to be in a fault state, when the initial charging voltages of k remaining submodules SM1 to SM3 other than the first submodule SM4 is less than the total voltage M of the converter arm including total N submodules SM1 to SM4 by a voltage of M/k. In the above example, the total voltage M of the converter arm is 4000V, and the voltage of 1000V are developed across each of the k submodules SM1 to SM3. Since the voltage of 1000V is smaller than 1330V, which is M/k, it is determined that SM4 that has transmitted a fault signal is in a fault state. Of course, in this case, it may be determined that a fault has occurred in one of the k submodules SM1 to SM3. However, when the voltage of 1000V is developed equally across all the k submodules SM1 to SM3, it is very likely that SM4 is faulty.

Here, in the case of FIG. 5D, since the SM4 submodule is faulty, a current is to be bypassed in SM4, but when the voltage is stored, there is a risk of explosion during operation of the MMC converter. In addition, in the situation of FIG. 5D, the submodule SM4 which is faulty is normally charged to the initial charging voltage, but the upper level controller 120 cannot recognize it and the same voltage is stored in the submodule SM4 along the remaining submodules according to the principle of voltage distribution.

Since a current is bypassed in a submodule in which a fault occurs as shown in FIG. 5B, there may occur a problem that the submodules SM1 to SM3 store a lower voltage actually although it is required that the other submodules SM1 to SM3 in a normal state need to store a higher voltage.

Therefore, according to the present invention, it is possible to take appropriate measures on a corresponding submodule in advance before the operation of the MMC converter through diagnosis of a fault of the submodule, In the above description, although it is described that all the components constituting the embodiment of the present invention are integrally combined or operated in combination, the present invention is not necessarily limited to such an embodiment. That is, within the scope of the present invention, all of the components may be operated in at least one selective combination. In addition, the terms "comprise", "constitute", or "have" described above mean that corresponding components may be included unless specifically stated otherwise. Accordingly, it should be construed that other components are not excluded, but may further be included. All terms including technical and scientific terms have the same meanings as commonly understood by those skilled in the art unless otherwise defined. Such terms as those defined in a generally used dictionary are to be interpreted as having meanings equal to the contextual meanings in the relevant field of art, and are not to be interpreted as having ideal or excessively formal meanings unless clearly defined as having such in the present invention.

The above description is merely illustrative of the technical idea of the present invention, and various modifications and variations may be made without departing from the essential characteristics of the present invention by those skilled in the art to which the present invention pertains. Accordingly, the embodiment disclosed in the present invention is not intended to limit the technical idea of the present invention but to describe the present invention, and the scope of the technical idea of the present invention is not limited by the embodiment. The scope of protection of the present invention should be interpreted by the following claims, and all technical ideas within the scope equivalent thereto should be construed as being included in the scope of the present invention.

The invention claimed is:

1. A method for diagnosing a state of a submodule in initial charging of an MMC converter, comprising:
   identifying, by an upper level controller, a stopped state of the MMC converter;
   switching a mode of the MMC converter to an initial charging mode in order for normal operation of the MMC converter when the MMC converter is in the stopped state;
   supplying, by the upper level controller, an alternating current (AC) voltage from an AC side to N submodules in the MMC converter when the mode is switched to the initial charging mode;
   charging a capacitor in the submodule with the supplied AC voltage to store an initial charging voltage in the capacitor;
   determining, by a submodule controller of the submodule, whether a fault in the submodule has already occurred and transmitting a fault signal to the upper level controller when the fault in the submodule has already occurred;
   detecting, by a voltage detector of the submodule in which a fault has not already occurred, the initial charging voltage stored in the capacitor and transmitting the initial charging voltage to the submodule controller;
   transmitting, by the submodule controller, the received initial charging voltage to the upper level controller; and
   determining, by the upper level controller, whether the fault signal for at least one first submodule of the N submodules is received from the submodule controller and diagnosing a state of each of the submodules using the initial charging voltages of the submodules,
   wherein, in a state in which the fault signal for the at least one first submodule of the N submodules is not received, when an initial charging voltage of a first submodule is received and the received initial charging voltage of the first submodule is equal to initial charging voltages of other remaining submodules, the upper level controller determines that the first submodule is in a normal state, and when the initial charging voltage of the first submodule is not received or the initial charging voltage of the first submodule which is different from the initial charging voltages of the other remaining submodules is received, the upper level controller determines that the first submodule is in a fault state.

2. A method for diagnosing a state of a submodule in initial charging of an MMC converter, comprising:
   identifying, by an upper level controller, a stopped state of the MMC converter;
   switching a mode of the MMC converter to an initial charging mode in order for normal operation of the MMC converter when the MMC converter is in the stopped state;
   supplying, by the upper level controller, an alternating current (AC) voltage from an AC side to N submodules in the MMC converter when the mode is switched to the initial charging mode;
   charging a capacitor in the submodule with the supplied AC voltage to store an initial charging voltage in the capacitor;
   determining, by a submodule controller of the submodule, whether a fault in the submodule has already occurred and transmitting a fault signal to the upper level controller when the fault in the submodule has already occurred;
   detecting, by a voltage detector of the submodule in which a fault has not already occurred, the initial charging voltage stored in the capacitor and transmitting the initial charging voltage to the submodule controller;
   transmitting, by the submodule controller, the received initial charging voltage to the upper level controller; and
   determining, by the upper level controller, whether the fault signal for at least one first submodule of the N submodules is received from the submodule controller and diagnosing a state of each of the submodules using the initial charging voltages of the submodules,
   wherein, in a state in which the fault signal for the at least one first submodule of the N submodules is received, when an initial charging voltage of a first submodule is received and the received initial charging voltage of the first submodule is lower than initial charging voltages of other remaining submodules by a predetermined difference or more, the upper level controller determines that the first submodule is in a normal state, and when the initial charging voltage of the first submodule is received and the received initial charging voltage of the first submodule is equal to the initial charging voltages of the other remaining submodules, the upper level controller determines that the first submodule is in a fault state.

3. A method for diagnosing a state of a submodule in initial charging of an MMC converter, comprising:
   identifying, by an upper level controller, a stopped state of the MMC converter;
   switching a mode of the MMC converter to an initial charging mode in order for normal operation of the MMC converter when the MMC converter is in the stopped state;
   supplying, by the upper level controller, an alternating current (AC) voltage from an AC side to N submodules in the MMC converter when the mode is switched to the initial charging mode;
   charging a capacitor in the submodule with the supplied AC voltage to store an initial charging voltage in the capacitor;
   determining, by a submodule controller of the submodule, whether a fault in the submodule has already occurred and transmitting a fault signal to the upper level controller when the fault in the submodule has already occurred;
detecting, by a voltage detector of the submodule in which a fault has not already occurred, the initial charging voltage stored in the capacitor and transmitting the initial charging voltage to the submodule controller;
transmitting, by the submodule controller, the received initial charging voltage to the upper level controller; and
determining, by the upper level controller, whether the fault signal for at least one first submodule of the N submodules is received from the submodule controller and diagnosing a state of each of the submodules using the initial charging voltages of the submodules,
wherein, in a state in which the fault signal for the at least one first submodule of the N submodules is received, when a sum of initial charging voltages of k remaining submodules other than a first submodule is not equal to an entire voltage M of a converter arm including the N submodules, the upper level controller determines that the first submodule is in a fault state, and when initial charging voltages of k remaining submodules other than the first submodule is lower than the entire voltage M of the converter arm including the N submodules by a voltage of M/k, the upper level controller determines that the first submodule is in a fault state.

* * * * *